(12) United States Patent
Lee

(10) Patent No.: US 9,466,713 B2
(45) Date of Patent: Oct. 11, 2016

(54) NON-FLOATING VERTICAL TRANSISTOR STRUCTURE

(71) Applicant: INOTERA MEMORIES, INC., Taoyuan (TW)

(72) Inventor: Tzung-Han Lee, Taipei (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 14/702,771

(22) Filed: May 4, 2015

(65) Prior Publication Data
US 2016/0093732 A1 Mar. 31, 2016

(30) Foreign Application Priority Data

Sep. 25, 2014 (TW) .............................. 103133369 A

(51) Int. Cl.
*H01L 29/78* (2006.01)
*H01L 29/66* (2006.01)
*H01L 29/08* (2006.01)
*H01L 21/265* (2006.01)
*H01L 21/324* (2006.01)
*H01L 21/225* (2006.01)
*H01L 21/266* (2006.01)
*H01L 27/108* (2006.01)
*H01L 21/8234* (2006.01)

(52) U.S. Cl.
CPC ....... *H01L 29/7827* (2013.01); *H01L 21/2253* (2013.01); *H01L 21/266* (2013.01); *H01L 21/26586* (2013.01); *H01L 21/324* (2013.01); *H01L 27/10873* (2013.01); *H01L 27/10885* (2013.01); *H01L 29/0847* (2013.01); *H01L 29/66666* (2013.01); *H01L 21/823487* (2013.01)

(58) Field of Classification Search
CPC ............. H01L 29/7827; H01L 21/266; H01L 21/26586; H01L 27/10873; H01L 27/10885; H01L 21/2253; H01L 29/0847; H01L 29/66666; H01L 21/324
See application file for complete search history.

(56) References Cited

U.S. PATENT DOCUMENTS

| 7,928,490 B2* | 4/2011 | Chen .................... H01L 29/7827 257/302 |
| 8,362,537 B2* | 1/2013 | Kunkel ............. H01L 27/10823 257/296 |
| 8,481,431 B2* | 7/2013 | Rouh ................ H01L 21/31144 438/156 |
| 2009/0236656 A1* | 9/2009 | Sung ................. H01L 27/10876 257/329 |
| 2012/0302047 A1* | 11/2012 | Lee .................... H01L 27/10876 438/482 |
| 2013/0153990 A1* | 6/2013 | Lee .................... H01L 29/66666 257/329 |
| 2014/0061746 A1* | 3/2014 | Cho .................. H01L 29/41741 257/306 |

* cited by examiner

*Primary Examiner* — William Coleman
(74) *Attorney, Agent, or Firm* — Winston Hsu; Scott Margo

(57) ABSTRACT

A non-floating vertical transistor includes a substrate and a protuberant structure extending from the substrate. A segregating pillar is inside the protuberant structure. A pair of segregated bit-lines which are segregated by the segregating pillar is disposed in the substrate and in the protuberant structure and adjacent to the bottom of the segregating pillar. A gate oxide layer is attached to the sidewall of the protuberant structure. A word-line is adjacent to the gate oxide layer so that the gate oxide layer is sandwiched between the word-line and a doped deposition layer.

21 Claims, 19 Drawing Sheets

NON-FLOATING VERTICAL TRANSISTOR STRUCTURE

CROSS REFERENCE TO RELATED APPLICATION

This application claims priority from Taiwanese Patent Application No. 103133369, filed on Sep. 25, 2014, the contents of which are hereby incorporated by reference in their entirety for all purposes.

BACKGROUND OF THE INVENTION

1. Field of the Invention

The present invention generally relates to a non-floating vertical transistor and a method to form a non-floating vertical transistor. In particular, the present invention is directed to a non-floating vertical transistor structure which has segregating pillars to electrically segregate word-lines and a method to form the non-floating vertical transistor structure.

2. Description of the Prior Art

A gate is a core element in a semiconductor device and in charge of switching on or switching off the electrical current between the source and the drain in the semiconductor device. When an appropriate voltage is applied on the gate, the channel for the electrical current between the source and the drain is opened. The minimum voltage for opening the channel is called the threshold voltage (VT). Due to the internal capacitance in the semiconductor device, the floating body effect results in the problem of VT shift and jeopardizes the operation of the semiconductor device.

Accordingly, a novel semiconductor structure is still needed to overcome the problem of VT shift which is caused by the floating body effect and to correct the abnormal operation of the semiconductor device caused by the VT shift problem.

SUMMARY OF THE INVENTION

In the light of the above, the present invention proposes a non-floating vertical transistor structure and a method to form a non-floating vertical transistor structure. In order to solve the problem of VT shift caused by the floating body effect, the present invention proposes the introduction of a pair of segregated bit-lines which are segregated by a segregating pillar which is constructed by a different dopant type in the non-floating vertical transistor structure. In such a way, the problem of VT shift caused by the floating body effect may be diminished.

The present invention in a first aspect proposes a non-floating vertical transistor. The non-floating vertical transistor includes a substrate, a protuberant structure, a segregating pillar, a pair of segregated bit lines, a diffused doped layer, a doped deposition layer, a top layer, a gate oxide layer and a word-line. The substrate has a first dopant type. The segregating pillar is disposed in the core of the protuberant structure which extends from the substrate and has a second dopant type. The protuberant structure includes a segregating pillar, a pair of segregated bit-lines and a diffused doped layer. The pair is adjacent to the bottom of the segregating pillar, segregated by the segregating pillar and has the first dopant type. The diffused doped layer is adjacent to the top of the segregating pillar and has the first dopant type. The doped deposition layer covers a top surface of the protuberant structure. The top layer is disposed on the top surface of the protuberant structure and covers the doped deposition layer. The gate oxide layer is attached to the sidewall of the protuberant structure and in direct contact with the diffused doped layer, the substrate and part of the pair. The word-line directly contacts the gate oxide layer so that the gate oxide layer is sandwiched between the word-line and the doped deposition layer.

In one embodiment of the present invention, the protuberant structure is an island-like pillar.

In another embodiment of the present invention, the non-floating vertical transistor further includes multiple protuberant structures.

In another embodiment of the present invention, the word-line is disposed between two adjacent protuberant structures.

In another embodiment of the present invention, the protuberant structures which are adjacent to one another to have the word-line in between have a distance t, and the thickness of the word-line is d so that 2d<t.

In another embodiment of the present invention, the gate oxide segregates the protuberant structures which are adjacent to one another and the word-line extends between the protuberant structures which are adjacent to one another in a wave-like pattern.

In another embodiment of the present invention, the protuberant structures which are adjacent to one another to have the gate oxide in between have a space s and the thickness of the word-line is d so that s<2d.

In another embodiment of the present invention, each segregated bit-line in the pair has a cross-section of an L shape.

In another embodiment of the present invention, the first dopant type is N type and the second dopant type is P type.

In another embodiment of the present invention, the non-floating vertical transistor further includes an out-diffused layer which is sandwiched between the doped deposition layer and the diffused doped layer to serve as a top source/drain.

The present invention in a further aspect proposes a method to form a non-floating vertical transistor. First, a stack material layer is provided. The stack material layer includes a top layer, a doped deposition layer, a buffer layer and a substrate. The substrate has a first dopant type and the buffer layer has a second dopant type. Next, the stack material layer is patterned to form multiple protuberant structures in communicating space. Then, a vertical implanting procedure is carried out to form a segregating pillar which is disposed inside a protuberant structure and has the second dopant type. Later, a tilt-angle implanting procedure is carried out to form a pair of segregated bit-lines in protuberant structures and in the substrate. A pair of segregated bit-lines is adjacent to the bottom of the segregating pillar, segregated by the segregating pillar and has the first dopant type. Subsequently, a gate oxide layer is form to attach to the sidewall of the protuberant structures, to cover the bottom of the communicating space and to segregate the protuberant structures which are adjacent to one another. Afterwards, the communicating space which has the gate oxide layer on its bottom is filled with a metal to form a word-line to obtain the non-floating vertical transistor.

In one embodiment of the present invention, before patterning the stack material layer the method further includes a step to carry out an annealing procedure to form a set of out-diffused layers which is disposed between the doped deposition layer and the buffer layer to serve as atop source/drain. The out-diffused layers have the first dopant type.

In another embodiment of the present invention, the stack material layer is patterned so that the stack material layer becomes multiple island-like pillars in the communicating space.

In another embodiment of the present invention, before carrying out the vertical implanting procedure and the tilt-angle implanting procedure, the method further includes a step to fill the communicating space with a substitute silicon material which has diffusing dopant, a step to carry out a diffusing procedure so that the diffusing dopant diffuses outwards to the sidewall of the protuberant structures to make the sidewall of the protuberant structures form a diffused doped layer and to make the buffer layer vanish, and another step to remove the substitute silicon material after the diffusing procedure.

In another embodiment of the present invention, the vertical implanting procedure further includes a step to form a patterned photoresist to partially expose the top layer on the top of the protuberant structures, and another step to carry out the vertical implanting procedure in the presence of the patterned photoresist so that the vertical implanting procedure goes into the diffused doped layer of and into the substrate of the protuberant structures to form the segregating pillar.

In another embodiment of the present invention, the tilt-angle implanting procedure includes at least one tilt-angle ion implanting step. For example, a first tilt-angle ion implanting step and a second tilt-angle ion implanting step are respectively carried out. The first tilt-angle ion implanting step and the second tilt-angle ion implanting step respectively have different implanting angles to form a pair of segregated bit-lines in the vertical sidewall and in the bottom of the communicating space for use in protuberant structures. The pair is adjacent to the bottom of the segregating pillar, segregated by the segregating pillar and has the first dopant type.

In another embodiment of the present invention, the gate oxide layer is conformally attached to the sidewall of the protuberant structures, disposed between the protuberant structures which are adjacent to one another to electrically segregate the protuberant structures which are adjacent to one another. The word-line extends between the protuberant structures which are adjacent to one another in a wave-like shape to divide the communicating space into adjacent trenches.

In another embodiment of the present invention, the protuberant structures which are adjacent to one another to have the word-line in between have a distance t, and the thickness of the word-line is d so that 2d<t.

In another embodiment of the present invention, the protuberant structures which are adjacent to one another to have the gate oxide in between have a space s and the thickness of the word-line is d so that s<2d.

In another embodiment of the present invention, each segregated bit-line in the pair has a cross-section of an L shape.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 10 illustrates a gate oxide layer is formed.

DETAILED DESCRIPTION

Figure 1:
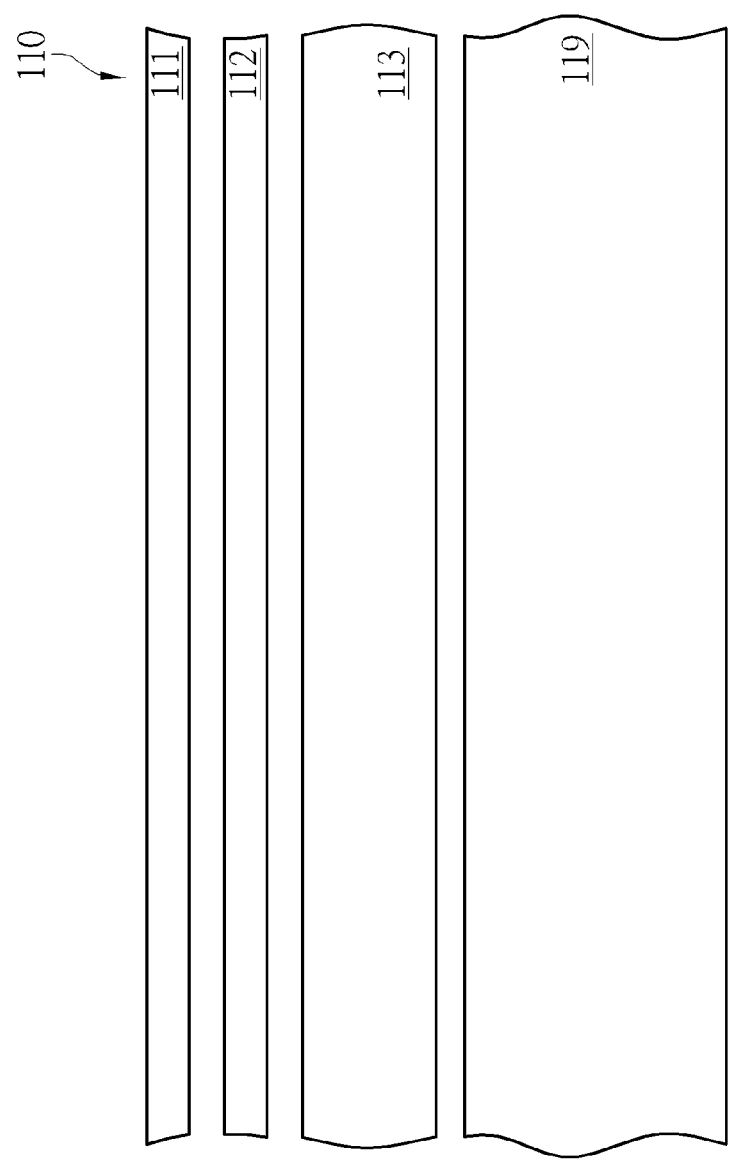
FIG. 1 to FIG. 10 illustrate a possible way to form a non-floating vertical transistor structure of the present invention.

The present invention in a first aspect provides a method to form a non-floating vertical transistor. FIG. 1 to FIG. 10 illustrate a possible way to form a non-floating vertical transistor structure of the present invention. First, please refer to FIG. 1, a stack material layer 110 is provided. The stack material layer 110 from top to bottom sequentially includes a top layer 111, a doped deposition layer 112, a buffer layer 113 and a substrate 119. The process to form the stack material layer 110, as shown in FIG. 1, maybe to form the buffer layer 113, the doped deposition layer 112, and the top layer 111 sequentially on the substrate 119 by a sputtering or a deposition process.

The substrate 119 is usually a semiconductive material, such as Si. Optionally, the substrate 119 usually has suitable dopant of a first conductivity type, such as P type or N type dopant, preferably P or P− type. The buffer layer 113 also has a semiconductive material, such as Si, disposed on the substrate 119 and covers the substrate 119. The buffer layer 113 has a dopant type, such as P type or N type dopant, preferably P− type. The buffer layer 113 serves as a buffer of the substrate 119 adjacent to the doped deposition layer 112. The doped deposition layer 112 is also a semiconductive material, such as deposited Si, disposed on the buffer layer 113 and has second dopant type opposite to the first dopant type, such as N+ type dopants, to serve as a set of top source/drain. The top layer 111 is a material which is easily patterned, such as a hard mask of silicon nitride.

Figure 2:
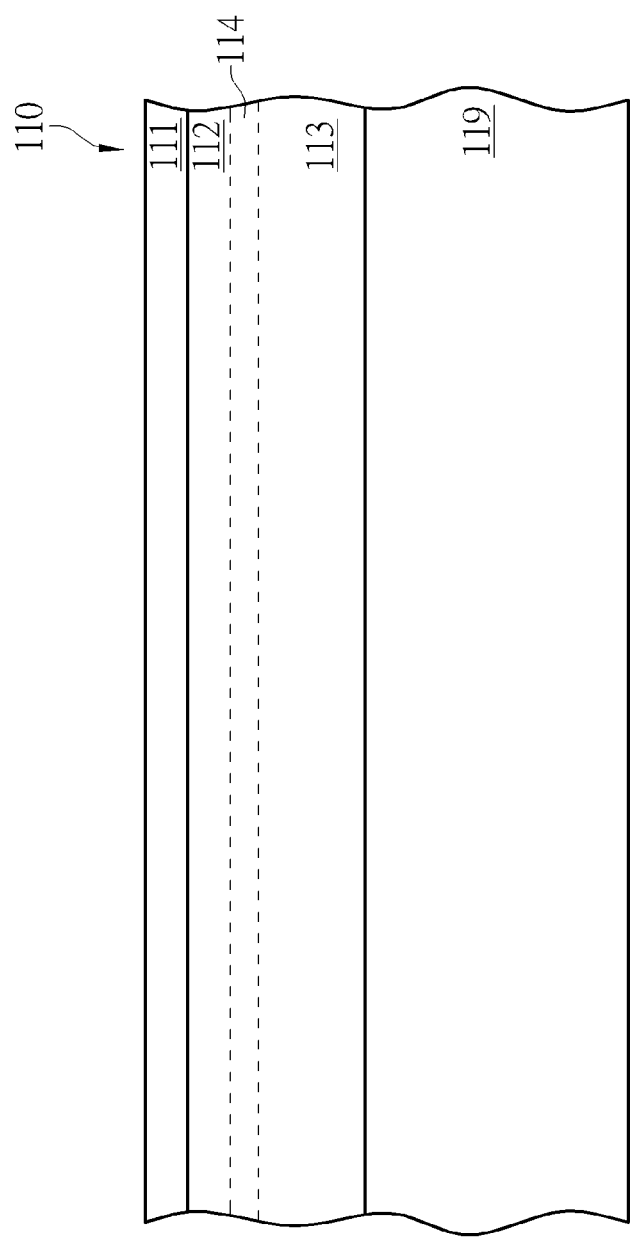

Next, please refer to FIG. 2, an annealing procedure is carried out. The annealing procedure is used to from a new out-diffused layer 114 between the doped deposition layer 112 and the buffer layer 113 by the annealing thermal diffusion of dopant. Preferably, the dopant type of the out-diffused layer 114 is up to the combination of the dopant type of the doped deposition layer 112 along with that of the buffer layer 113, such as N− or P− type.

Subsequently, the top layer 111 is optionally patterned to be an etching mask. The etching mask is used to define the following protuberant structures (not shown) in the non-floating vertical transistor (not shown). The top layer 111 may be patterned by conventional lithographic or etching steps in the presence of a photoresist material to obtain the needed etching mask. The patterned top layer 111 after the patterning procedure may be multiple individual squares without contacting one another.

Figure 3:
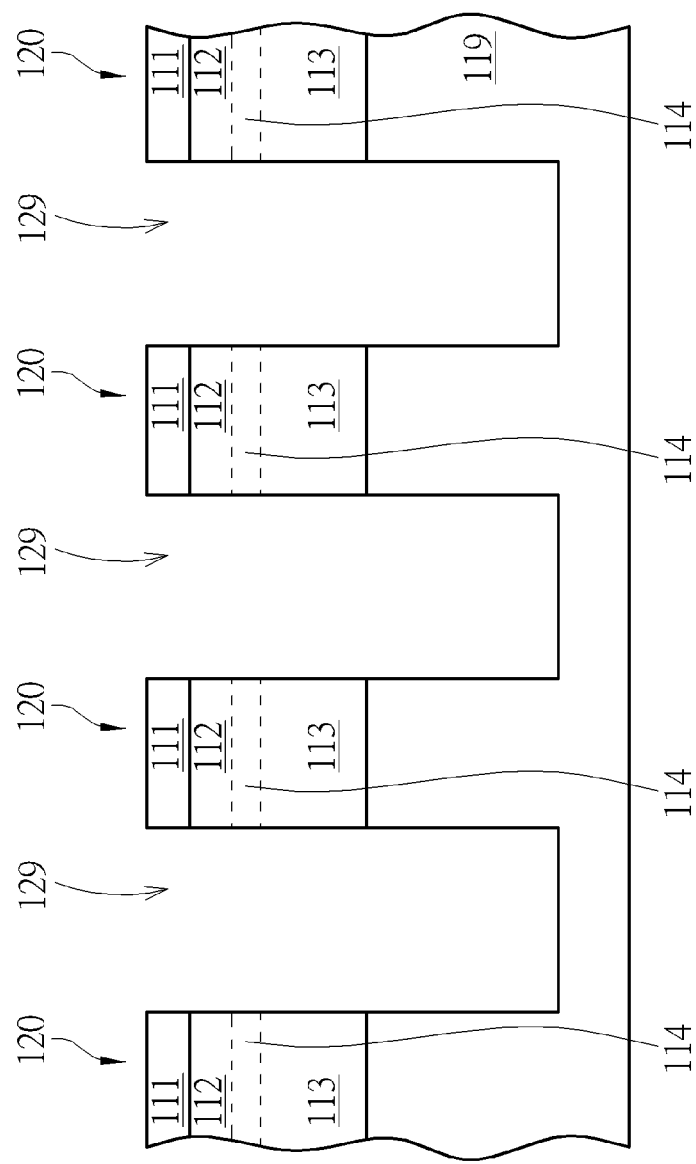
Figure 3A:
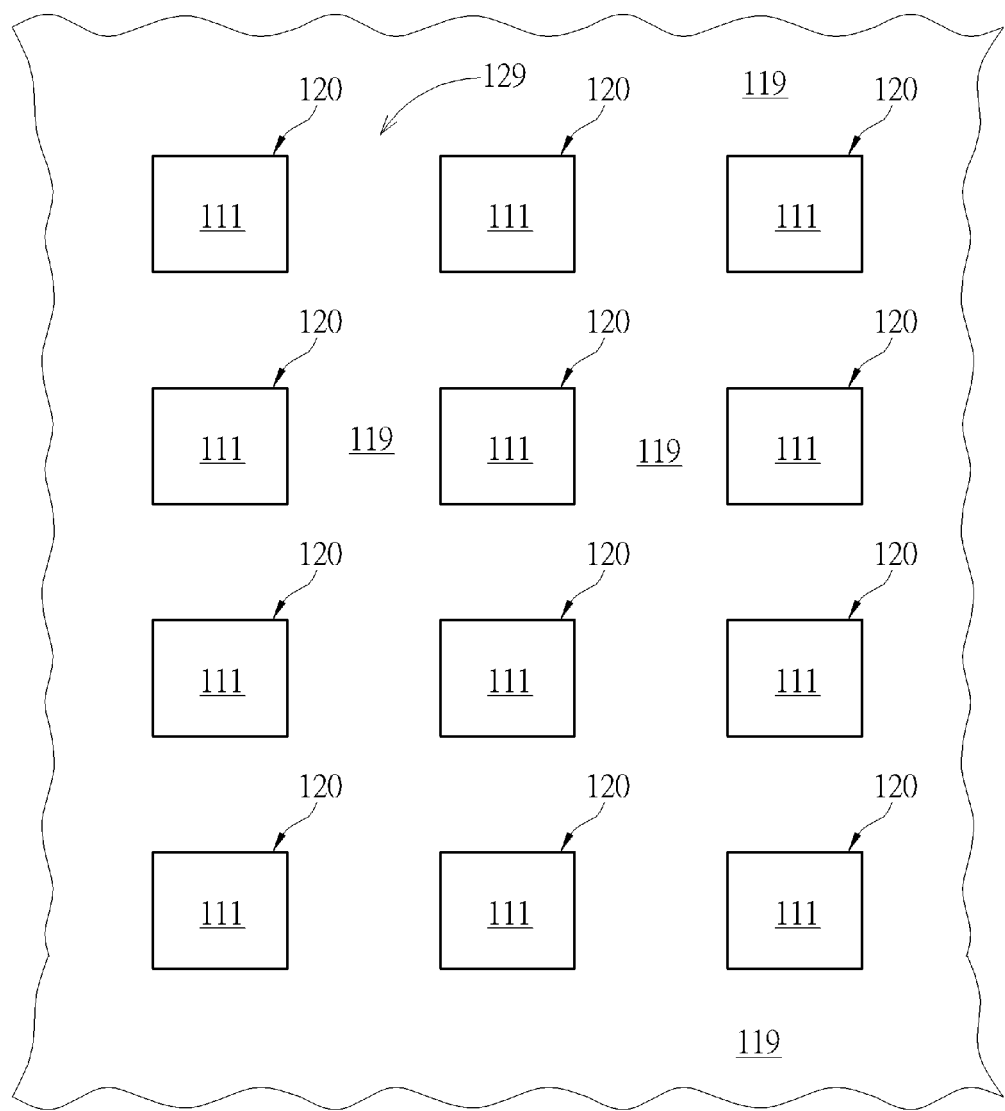
FIG. 3A illustrates a top view corresponds to FIG. 3 which includes the patterned top layer.
Figure 4:
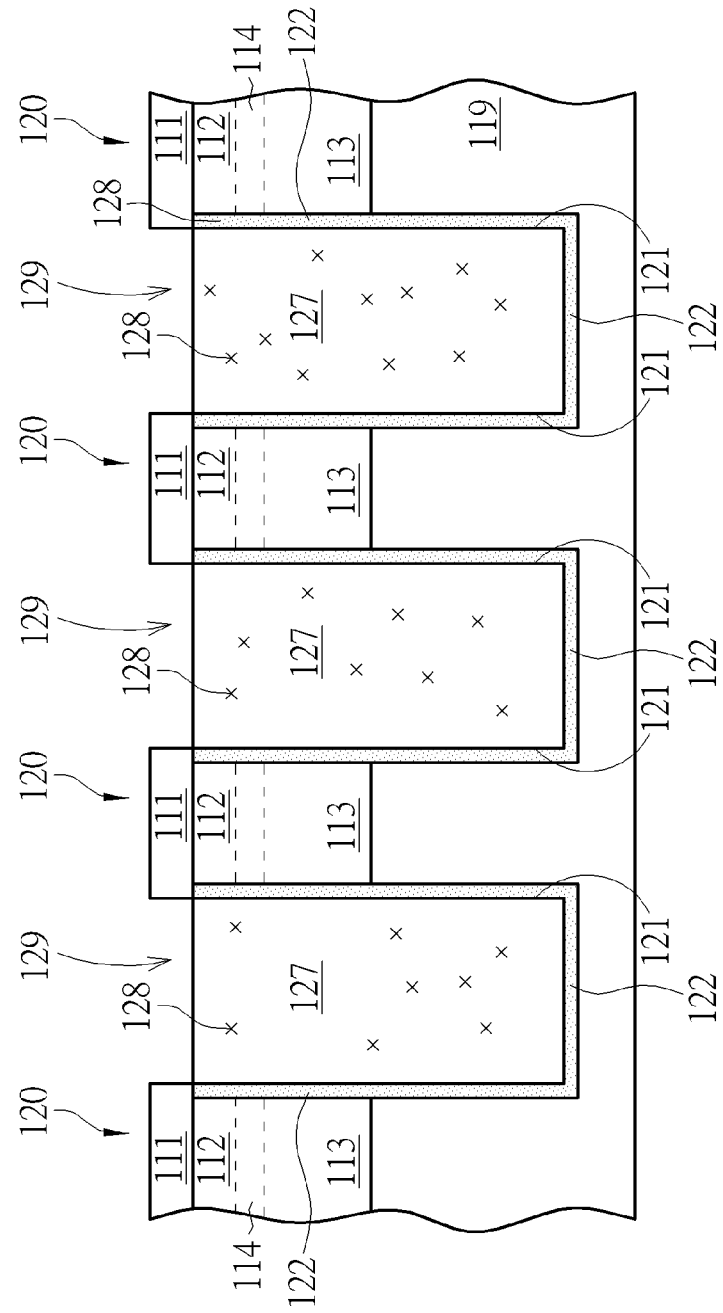

Later, please refer to FIG. 3, the patterned top layer 111 is used to etch the stack material layer 110 with the help of a suitable etching recipe. A suitable etching recipe may etch the different material layers, such as the doped deposition layer 112, the buffer layer 113, and the substrate 119 in the stack material layer 110 one or more times. A combination of suitable etching recipes may be used to respectively etch the stack material layer 110 so that the stack material layer 110 becomes protuberant structures 120. To etch the stack material layer 110 may form the communicating space 129 as well. Preferably, the substrate 119 may be over-etched to expose the substrate 119 which becomes the lower part of the protuberant structures 120. The depth of the substrate 119 by the over-etching may be adjusted to modify the final height of the non-floating vertical transistor structure. FIG. 3A illustrates a top view corresponds to FIG. 3 which includes the patterned top layer 111. In FIG. 3A, protuberant structures 120 which are covered with the patterned top layers 111 are cube-shaped, such as island-like pillars without contacting one another.

Figure 5:
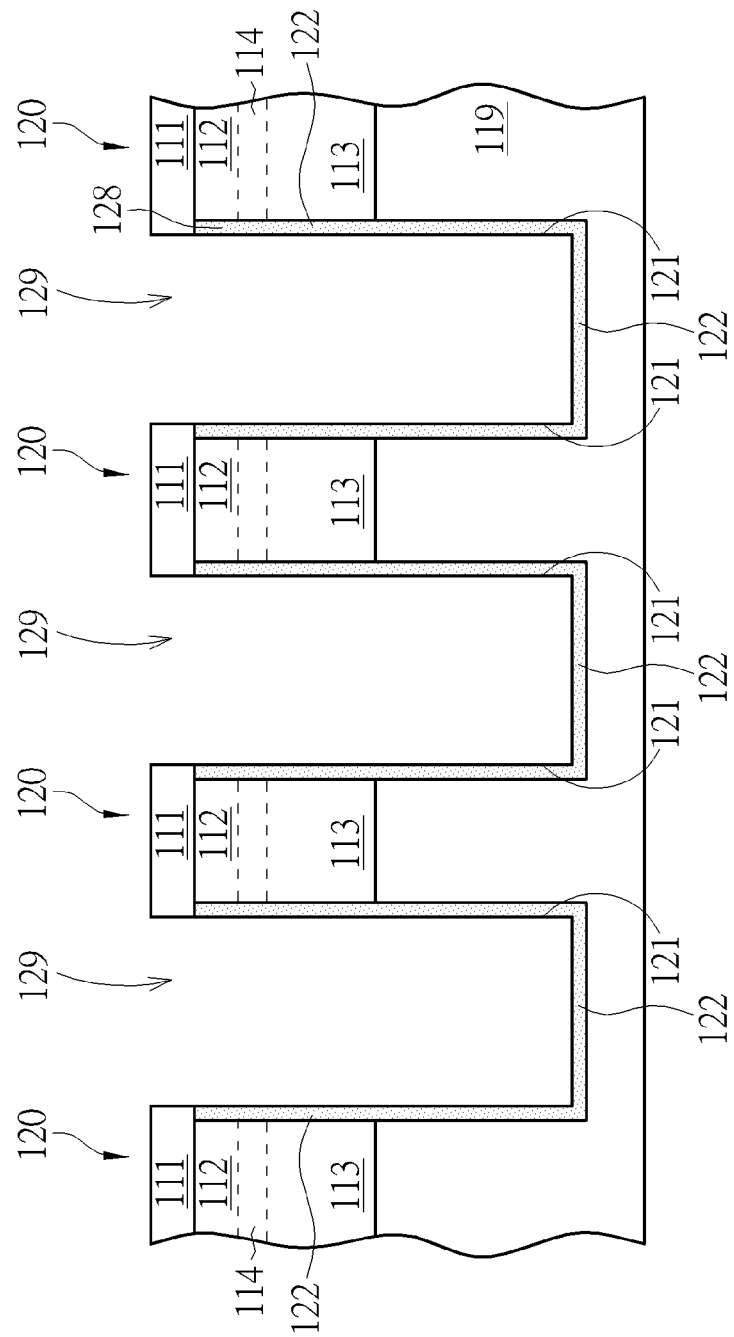

In a following step, the internal part of the protuberant structures 120 is adjusted to construct a diffused doped layer. Please refer to FIG. 4, the communicating space 129 is filled with a substitute silicon material 127 which contains diffusible dopant 128. Next, please go on referring to FIG. 4, a diffusing procedure, such as a thermal step, is carried out, for example 960° C. for 10 mins, to make the diffusible dopant 128 diffuse outwards into the sidewall 121 of the protuberant structure 120 so that the sidewall 121 of the protuberant structure 120 becomes a diffused doped layer 122. The diffused doped layer 122 which is formed in the diffusing procedure partially replaces the buffer layer 113 to adjust the Vt (threshold voltage) of the non-floating vertical transistor. Later, after the diffusing procedure is carried out, the substitute silicon material 127 along with the diffusible dopant 128 may be removed, as shown in FIG. 5.

Figure 6:
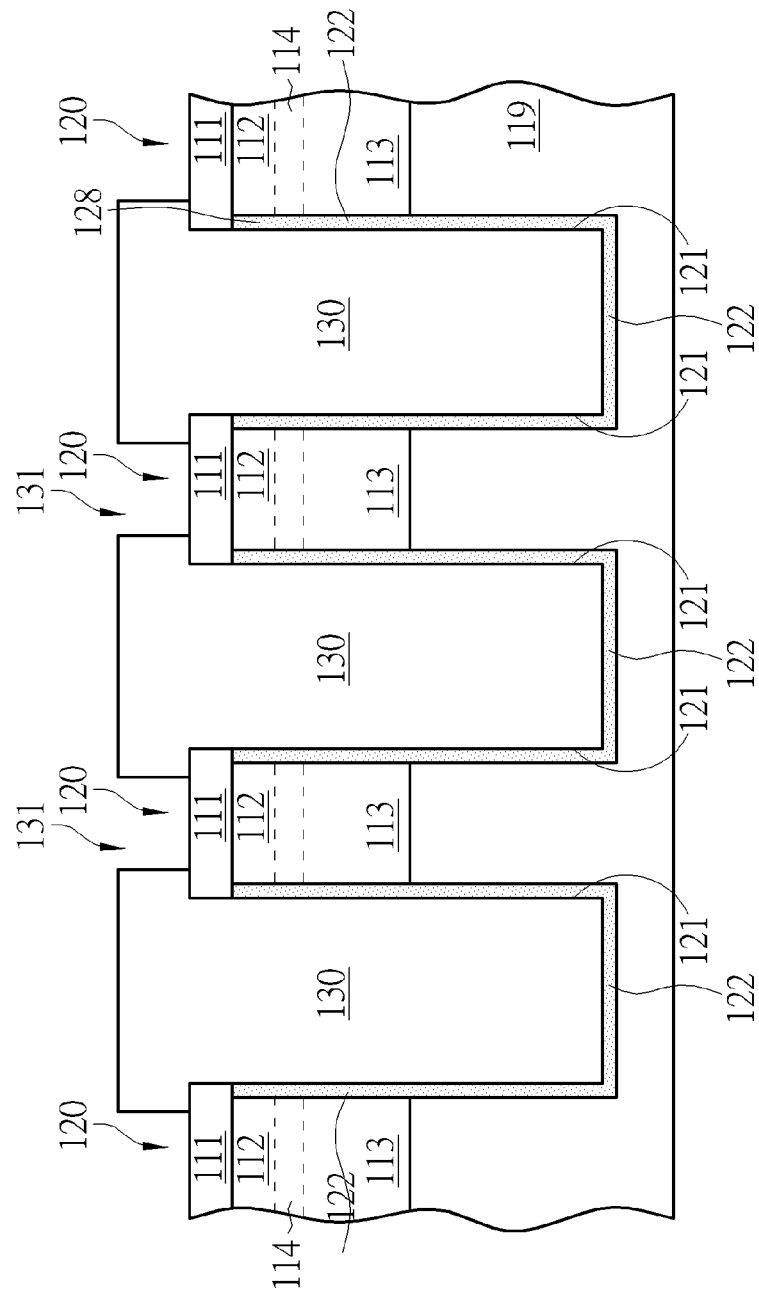
Figure 6A:
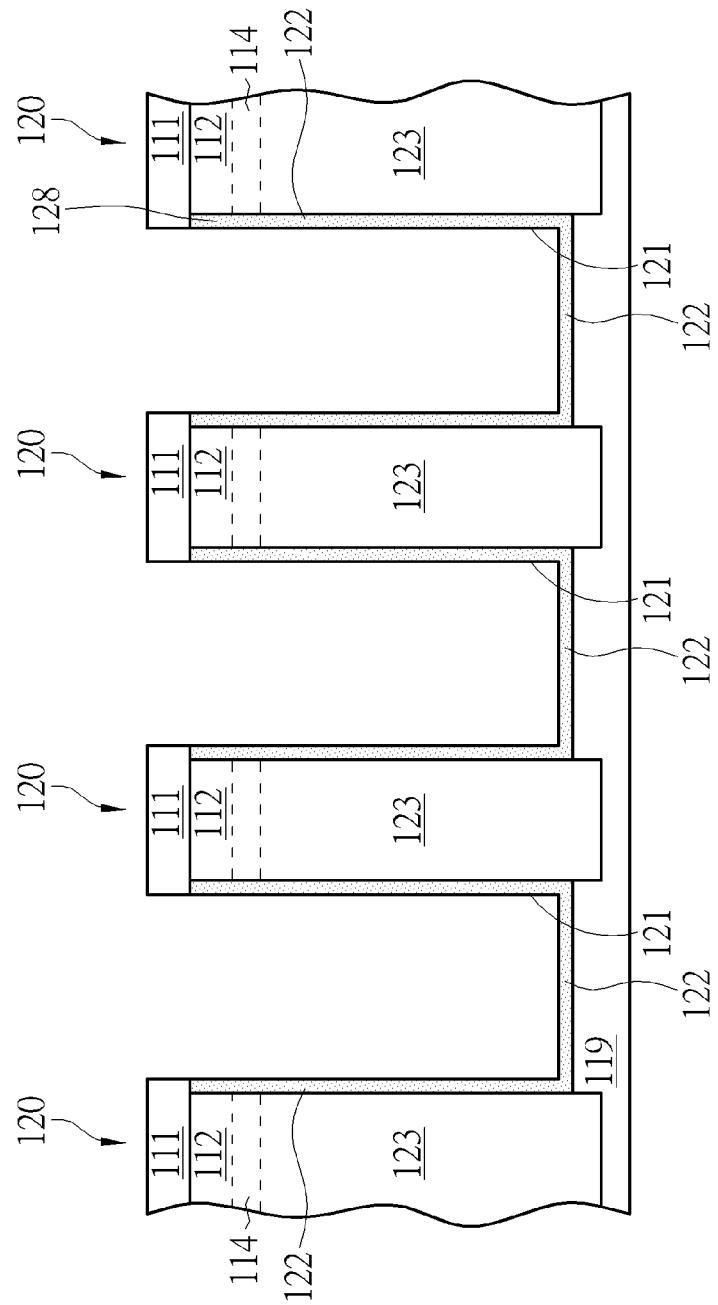
FIG. 6A illustrates a result after a vertical implanting procedure is carried out.

To be continued, segregating pillars are formed in the protuberant structures 120. A needed segregating pillar may be formed by a penetrating vertical implanting procedure. For example, please refer to FIG. 6, firstly a patterned photoresist 130 with at least one opening 131 is formed on the top layer 111. One opening 131 is disposed on the top of one protuberant structure 120 to expose part of the top layer 111. Please note that the size of the opening 131 has to be smaller than that of the top layer 111 after patterning, preferably the opening 131 is disposed at the center of the top layer 111 after patterning. Secondly, please refer to FIG. 6A, a vertical implanting procedure is carried out in the presence of the patterned photoresist 130. The parameters of the vertical implanting procedure are needed to be suitably adjusted so that the dopant of the vertical implanting procedure may deeply go into the diffused doped layer 122 and into the substrate 119 of the protuberant structure 120 to form the segregating pillars 123, preferably of P+ type, for example with boron ions at an energy 150Kev of the dose $1*10^{14}$ ions/cm$^2$. The patterned photoresist 130 blocks the dopant of the vertical implanting procedure so that the dopant of the vertical implanting procedure is restricted to the core of the protuberant structures 120. After the needed segregating pillars 123 are formed, the patterned photoresist 130 is removed.

Figure 7:
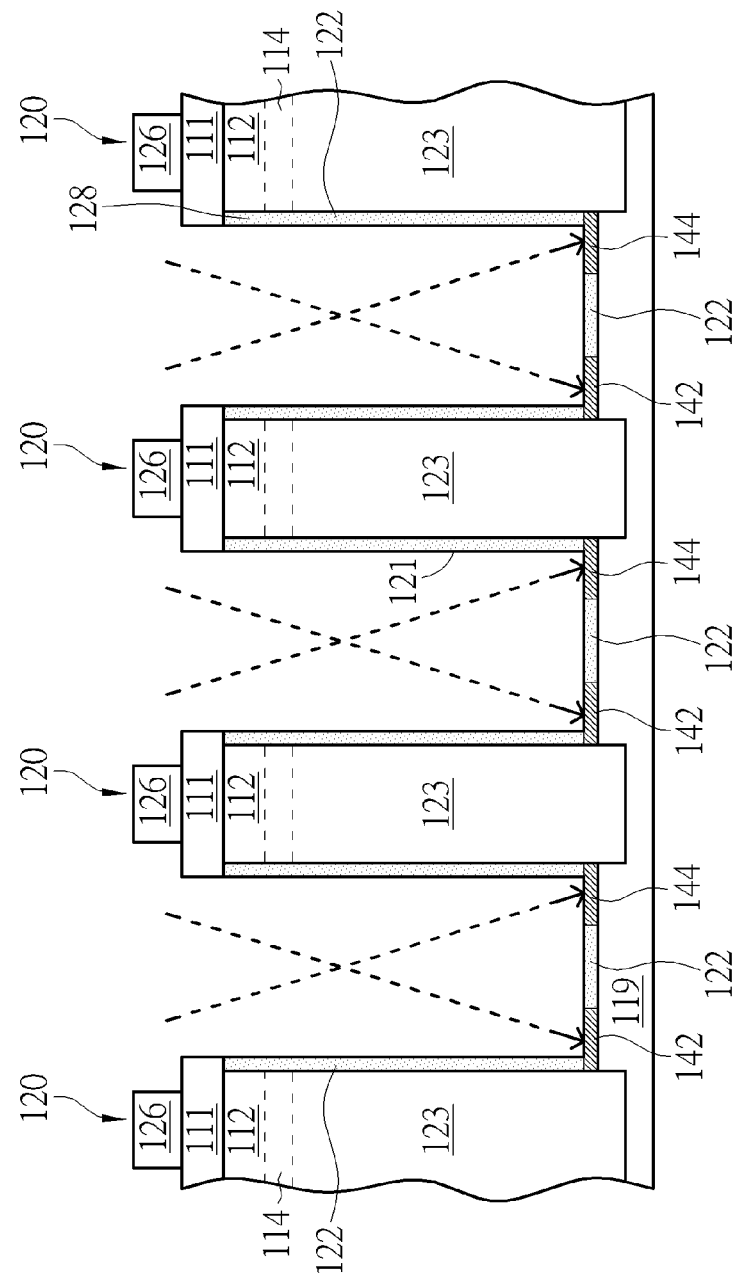
Figure 7A:
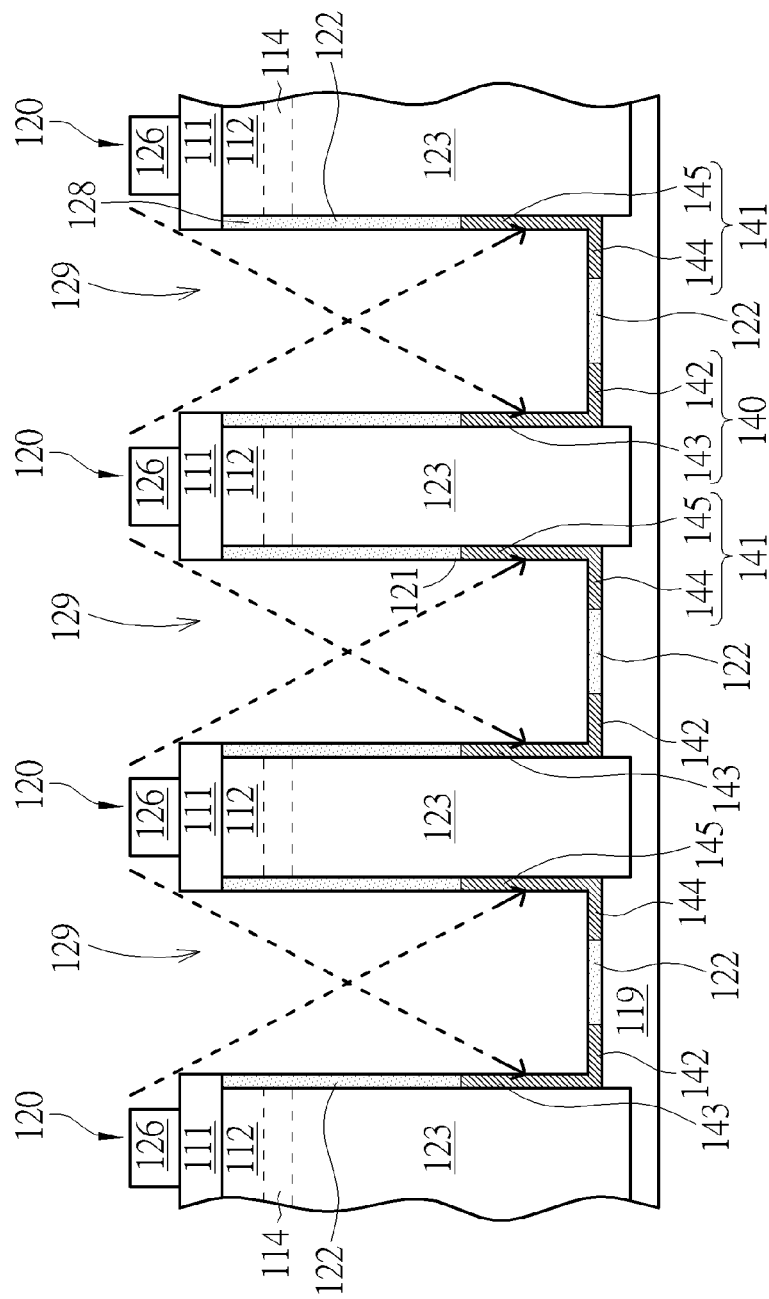
FIG. 7A illustrates each segregated bit-line in the pair has a cross-section of an L shape.

Then, bit-lines are formed in the protuberant structures 120. A tilt-angle implanting procedure may be used to form the needed bit-lines, preferably the bit-lines are segregated by the segregating pillars. A tilt-angle implanting procedure may include one or more tilt-angle ion implanting steps, preferably each tilt-angle ion implanting step is respectively carried out. For example, as shown in FIG. 7, a first tilt-angle implanting step is carried out. The first tilt-angle implanting step has a first implanting angle to form horizontal implanting regions 142/144. Next, as shown in FIG. 7A, a second tilt-angle implanting step is carried out. The second tilt-angle implanting step has a second implanting angle to form vertical implanting regions 143/145. Each implanting procedure may use, for example, phosphorus ions at an energy 10 Kev of the dose $1*10^{14}$ ions/cm$^2$. Because the first tilt-angle implanting step and the second tilt-angle implanting step each has a different implanting angle, a pair of segregated bit-lines 140/141 is accordingly formed in the vertical sidewall 121 and in the bottom 124 of the communicating space 129, in the substrate 119 for use in the protuberant structures 120. The pair of segregated bit-lines 140/141 is adjacent to the bottom of the segregating pillars 123, segregated by the segregating pillars 123 and has the second dopant type, such as N type dopant to serve as a set of bottom source/drain to be pair with the top source/drain. Simultaneously, the diffused doped layers 122 sandwiched between the doped deposition layer 112 and the vertical implanting regions 143/145 serve as the channel region of the non-floating vertical transistor.

Figure 7B:
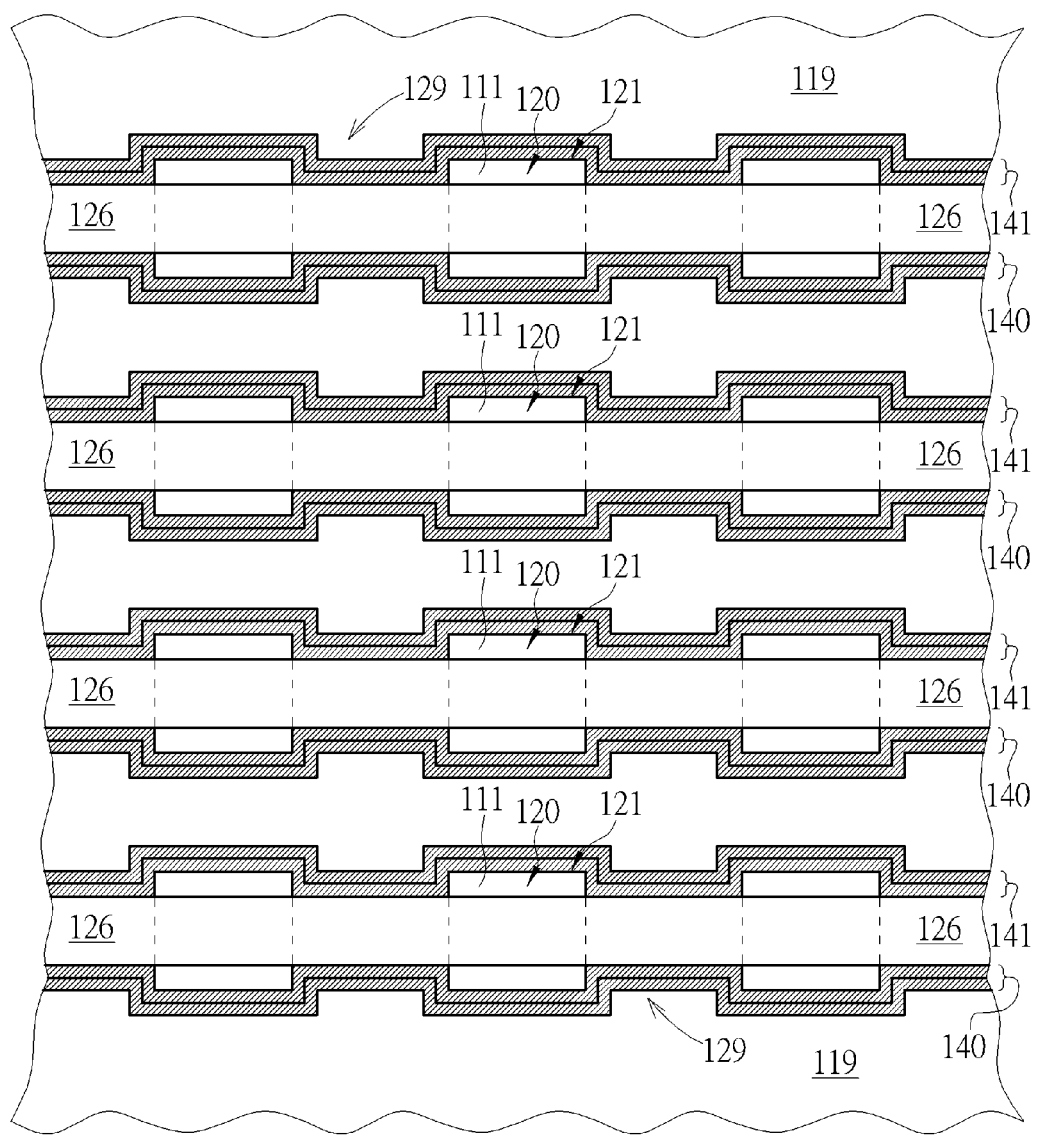
FIG. 7B illustrates an auxiliary photoresist is used to form the electrically segregated bit-lines.

In particular, because the first implanting angle is different from the second implanting angle, two different implanting regions 142/144 and 143/145 are respectively formed in the protuberant structures 120. The horizontal implanting regions 142/144 and the vertical implanting regions 143/145 join together to form a pair of segregated bit-lines 140/141. Due to the segregation of the segregating pillars 123, different implanting regions 142/144 and 143/145 are not capable of going beyond the segregating pillars 123 so a pair of segregated bit-lines 140/141 is segregated by the segregating pillar 123. Please notice that the order of the first tilt-angle implanting step and the second tilt-angle implanting step is not important as long as the horizontal implanting regions 142/144 and the vertical implanting regions 143/145 are capable of joining together to form a pair of segregated bit-lines 140/141. As shown in FIG. 7A, each segregated bit-line 140 and 141 in the pair 140/141 has a cross-section of an L shape, preferably the segregated bit-lines 140 and 141 are symmetrical with respect to each other. In particular, the vertical implanting regions 143/145 may have suitable height. FIG. 7B illustrates the first tilt-angle implanting step and the second tilt-angle implanting step may be carried out in the presence of an auxiliary photoresist 126 to form the electrically segregated bit-lines 140 and 141. After the first tilt-angle implanting step and the second tilt-angle implanting step, the photoresist 126 is removed.

Figure 8:
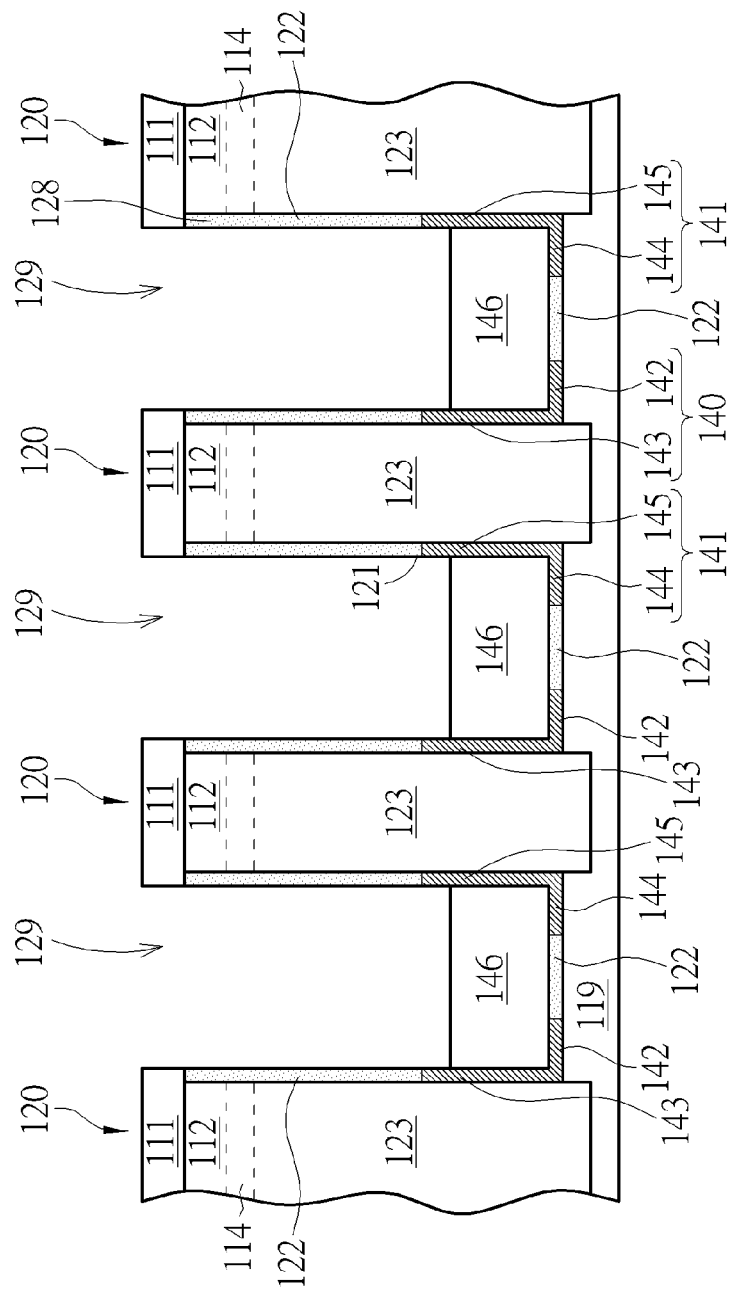

Later, please refer to FIG. 8, a segregating barrier 146 is formed at the bottom 124 of the communicating space 129 for electrical segregation. The segregating barrier 146 is made of an insulating material to block the potential leak current which passes through the substrate 119 between the symmetrical segregated bit-lines 140 and 141 at the bottom 124. The segregating barrier 146 may be formed by referring to the formation of the convention shallow trench isolation. First, the communicating space 129 is filled with an insulating material, such as silicon oxide, silicon nitride or silicon oxy-nitride. Then, an etching-back step is carried out to reduce the height of the top surface of the segregating barrier 146 so that the height of the top surface of the segregating barrier 146 is lower than that of the vertical implanting regions 143/145. On one aspect, if the height of the top surface of the vertical implanting regions 143/145 is too low, the resultant electrical segregation would not be ideal. On the other aspect, if the height of the top surface of the vertical implanting regions 143/145 is too much, the operation of the device would be disrupted. As a result, the implanting angles for the tilt-angle implanting regions are needed to be optimized so that the vertical implanting regions 143/145 have suitable heights.

Figure 9:
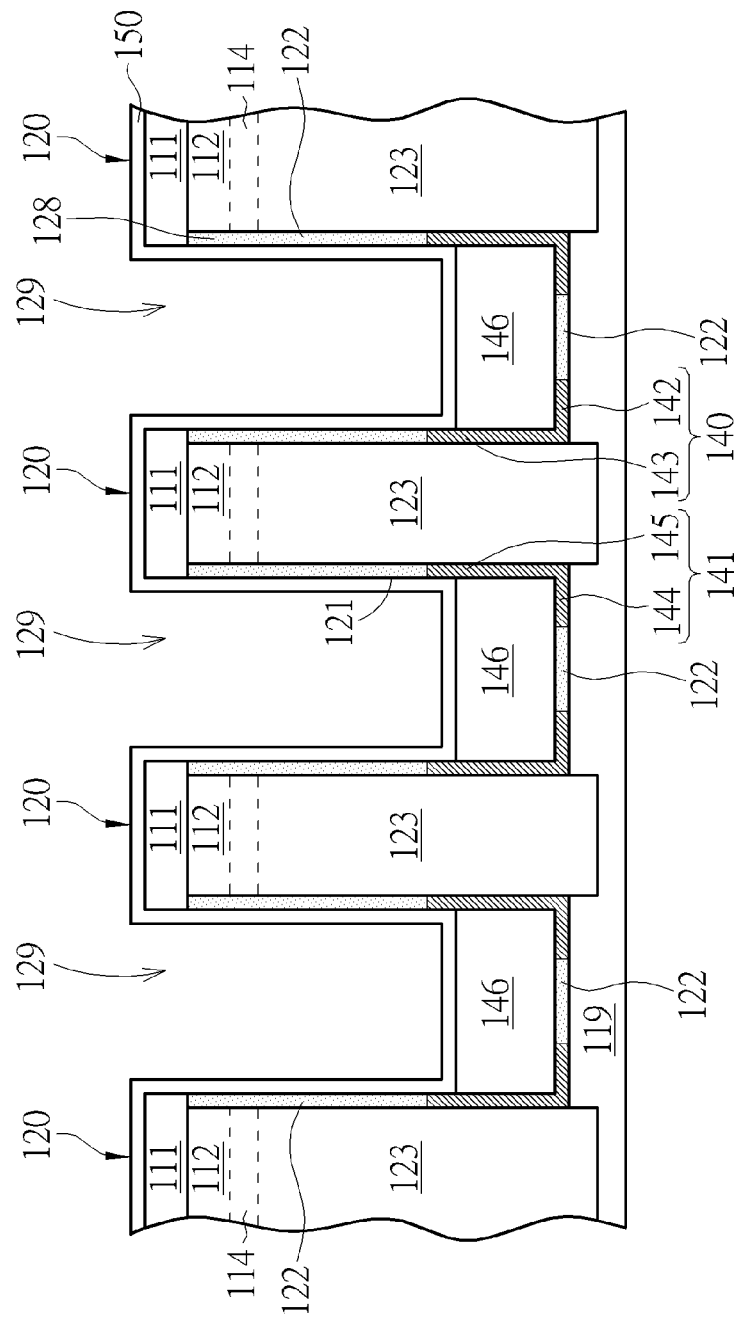
Figure 10:
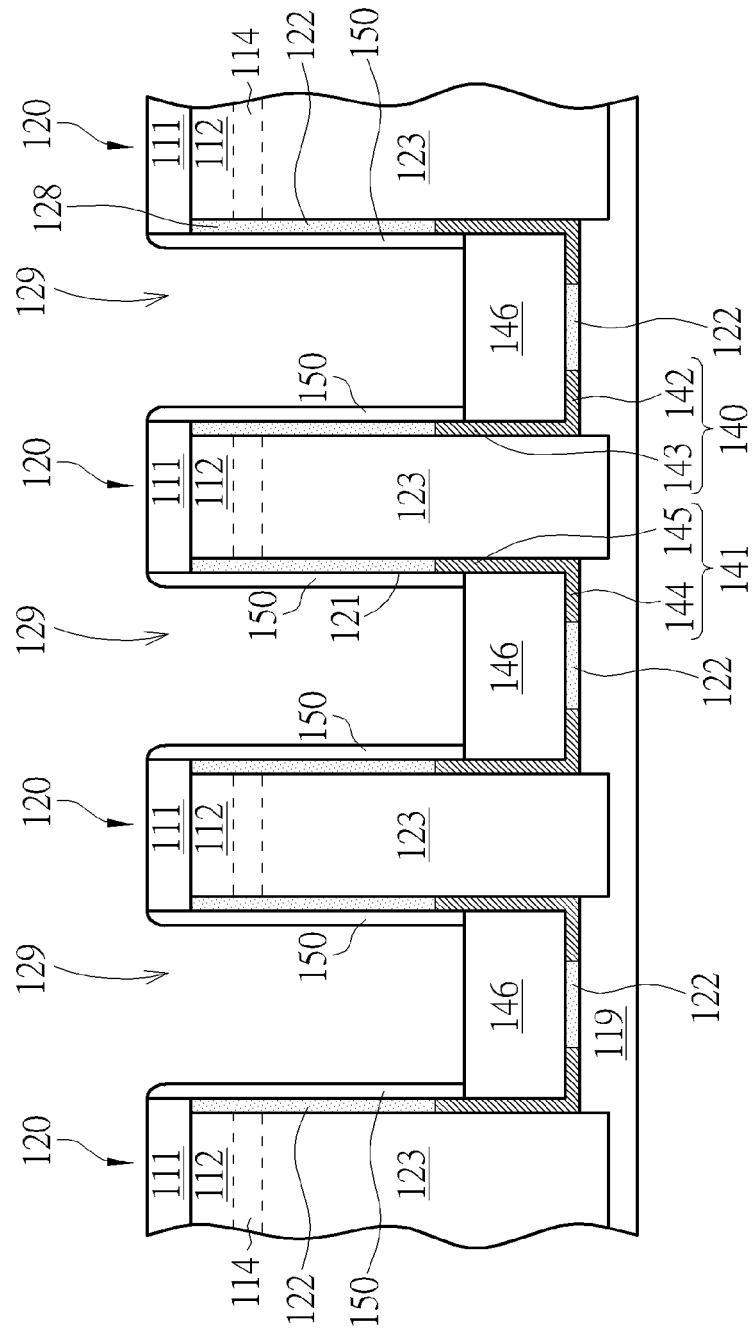
Figure 10A:
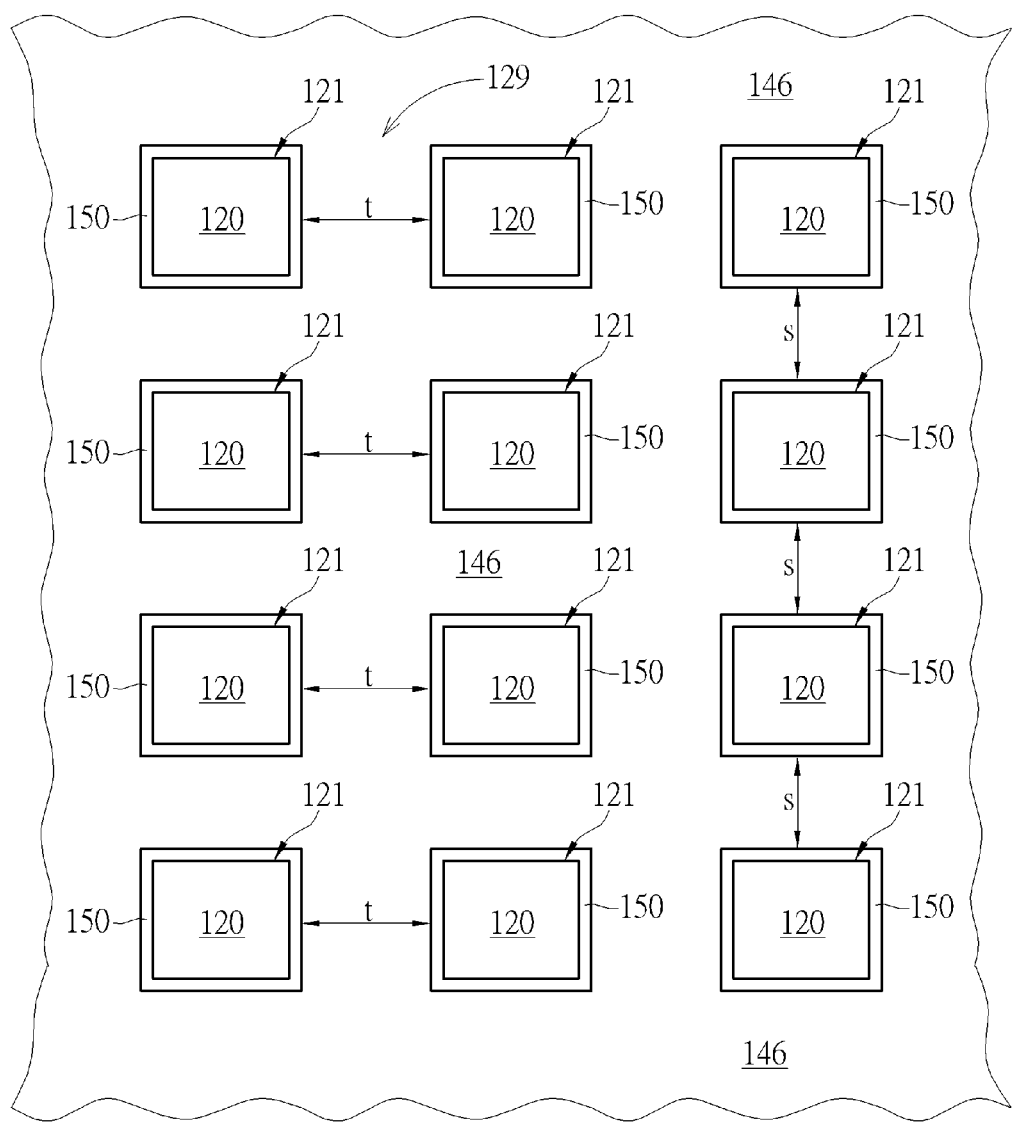
FIG. 10A illustrates a top view corresponds to FIG. 10.

Subsequently, a gate oxide layer is formed to attach to the sidewall of the protuberant structures 120. The thickness of the gate oxide layer may be 3 nm to 5 nm. As shown in FIG. 10, on one aspect the resultant gate oxide layer 150 is disposed between two adjacent protuberant structures 120, and on another aspect the resultant gate oxide layer 150 is conformally attached to the sidewall 121 of the protuberant structures 120 to serve as the gate oxide of a vertical transistor. The gate oxide layer 150 may be formed as follows. First, as shown in FIG. 9, a layer of an oxide 150 is formed to conformally attach to the sidewall 121 of the protuberant structures 120 by a rapid thermal oxidative process, such as an in-situ steam generation (ISSG). Next, the horizontal part of the oxide 150 is removed by an anisotropic etching to obtain the vertical gate oxide layer 150. Please refer to FIG. 10A, which is a top view of FIG. 10. Please note that the distance t or the space s between one protuberant structure 120 and another one protuberant structure 120 may not be necessarily the same at different horizontal directions.

Next, a conductive material is used to fill the trenches 152/153/154 which are derived from the communicating space 129 and padded with the gate oxide layer 150 to become the word-lines 161 which extend in one single direction so the non-floating vertical transistor is obtained. The word-lines 161 are sandwiched between the adjacent protuberant structures 120. There are various possible ways to use the conductive material 160 to form the word-lines 161 and some exemplary embodiments are given as follows. The conductive material 160 may be doped polysilicon or a metal, such as tungsten.

Figure 11:
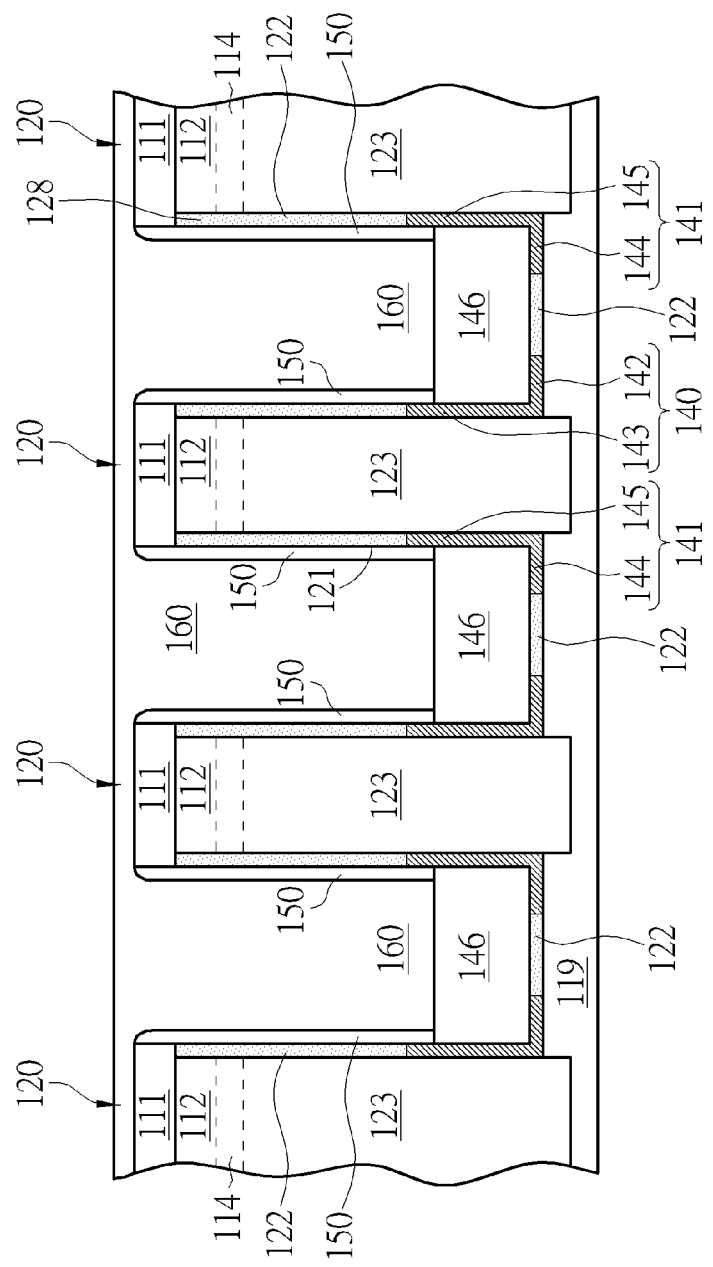
FIG. 11 illustrates a conductive material filling the communicating space.
Figure 12:
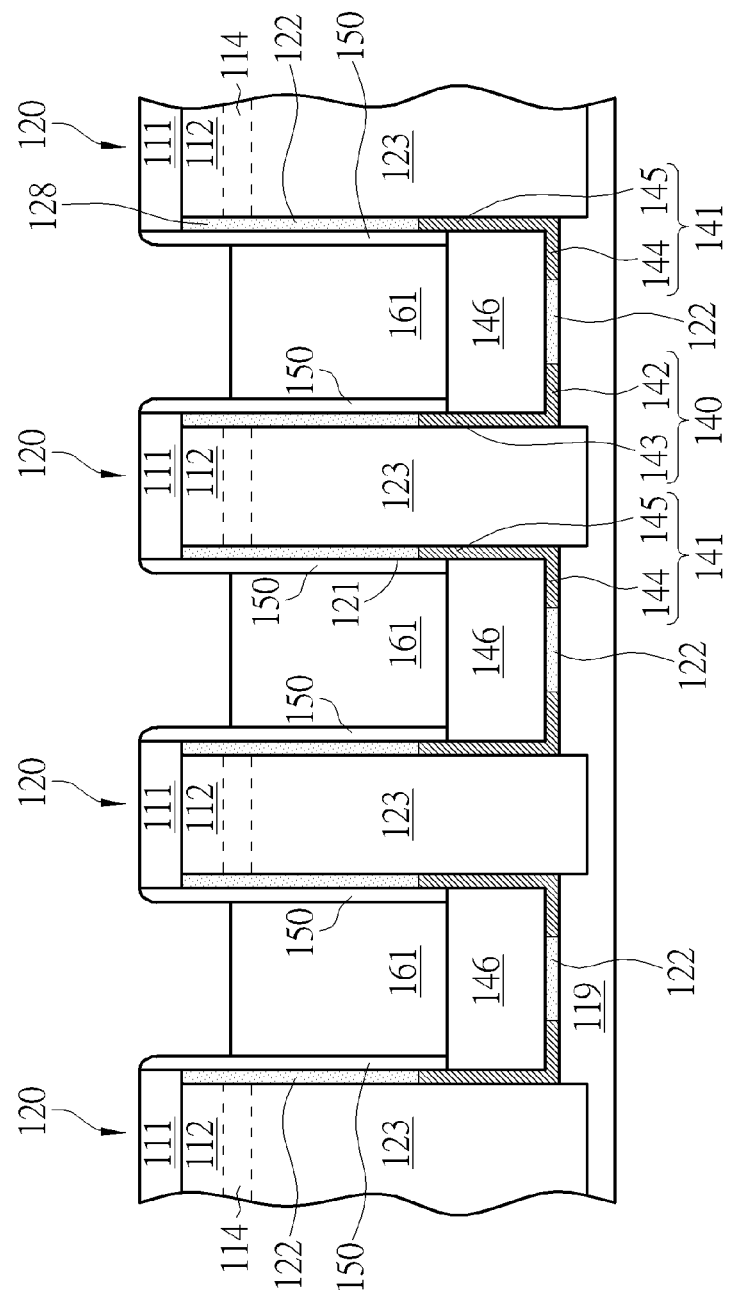
FIG. 12 illustrates a conductive material filling the communicating space.
Figure 12A:
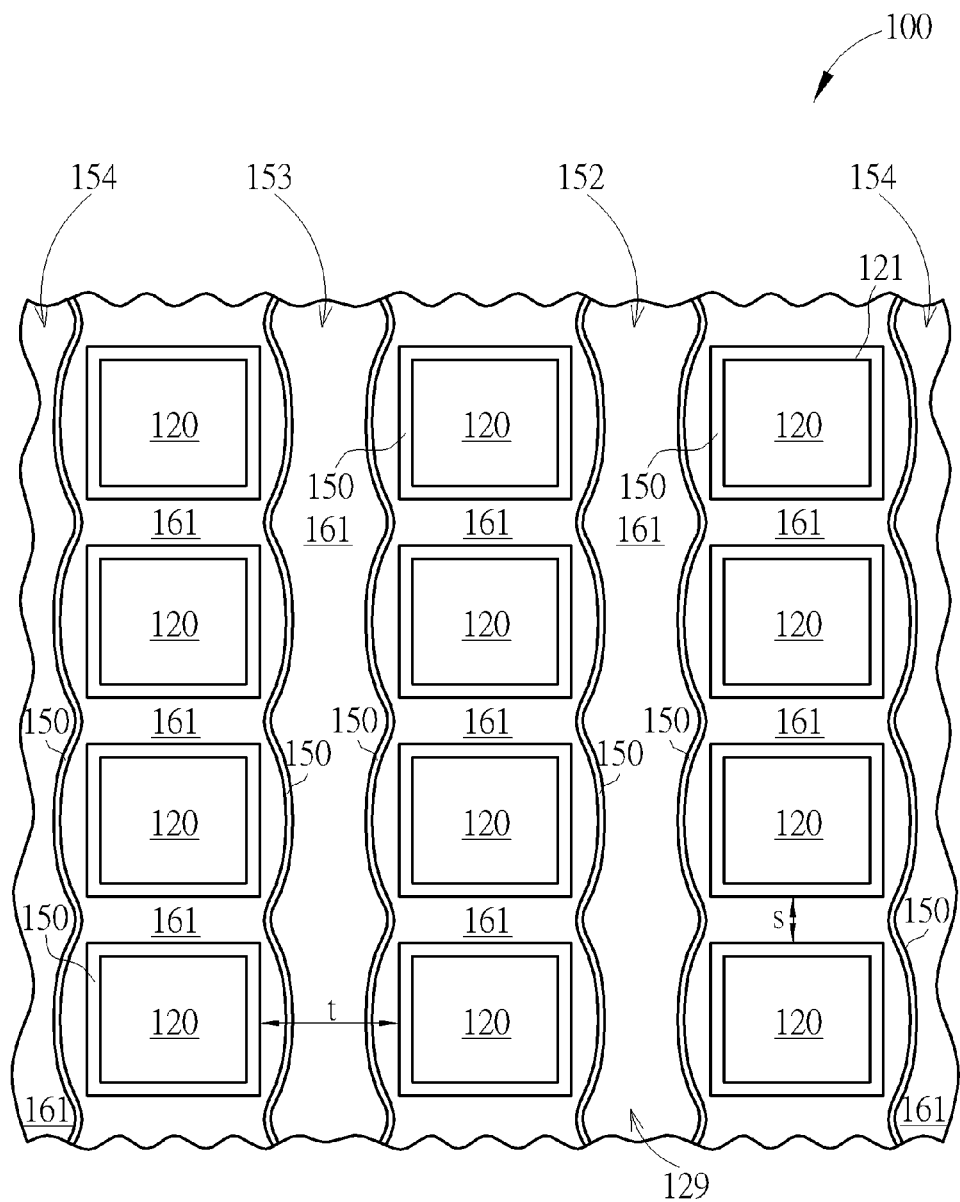
FIG. 12A illustrates a top view of one embodiment corresponds to FIG. 12.
Figure 12B:
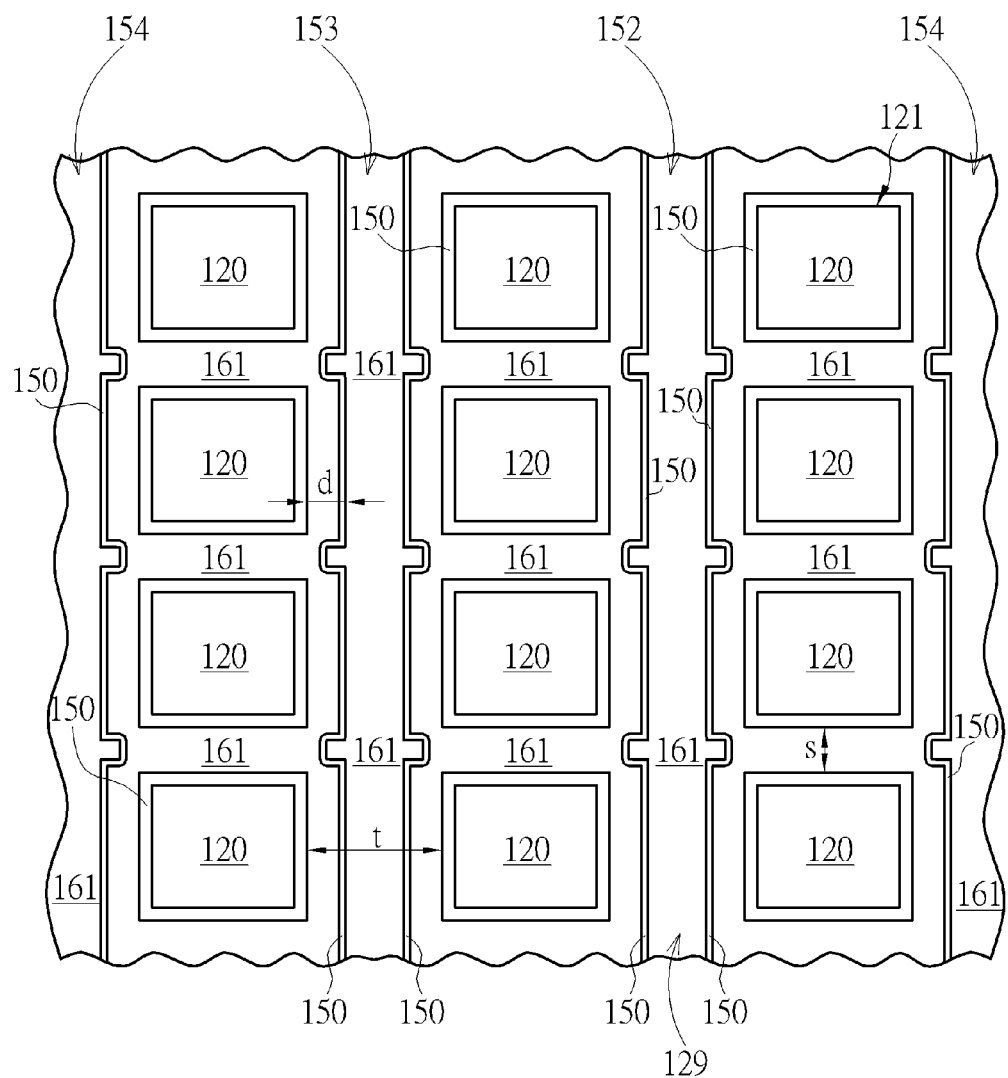
FIG. 12B illustrates a top view of another embodiment corresponds to FIG. 12.

The first way may be, as shown in FIG. 11, conformally filling the communicating space 129 with the conductive material 160 deposited on the protuberant structures 120. Then, after an anisotropic etching-back to remove the conductive material 160 above the top layer 111, multiple word-lines 161 are disposed in the space 129 and mutually electrically insulating. The result is shown in FIG. 12. FIG. 12A illustrates a top view of one embodiment which corresponds to FIG. 12. Multiple wavy word-lines 161 extend along the direction of the trenches 152/153/154. In another embodiment of the present invention, the distance between two adjacent protuberant structures 120 is t and it is preferably 2d<t so that the parallel and extending word-lines 161 are adjacent to one another but not physically connected to one another. FIG. 12B illustrates a top view of another embodiment which corresponds to FIG. 12. The thickness d of the conductive material 160 and the space s between the protuberant structures 120 may be adjusted so that the conductive material 160 fills up the space s of the protuberant structures 120. In another embodiment of the present invention, it is preferably s<2d so that the conductive material 160 continues in the extending direction.

Because the word-lines 161 are attached to the sidewall 121 of the protuberant structures 120, the adjacent word-lines 161 crookedly extend between adjacent protuberant structures 120 in a wavy way but the adjacent word-lines 161 are not physically connected to one another to make the adjacent word-lines 161 mutually electrically insulated. In such a way, the communicating space 129 is divided into multiple adjacent trenches 152/153/154 by the word-lines 161 due to the split of the word-lines 161.

After the above procedures, a non-floating vertical transistor 100 is obtained. FIG. 12, FIG. 12A, and FIG. 12B illustrate the structures of the non-floating vertical transistor 100 of the present invention. The non-floating vertical transistor 100 includes a substrate 119, a protuberant structure 120, a segregating pillar 123, a pair of segregated bit-lines 140/141, a diffused doped layer 122, an out-diffused layer 114, a doped deposition layer 112, a top layer 111, a gate oxide layer 150 and a word-line 161.

The substrate 119 is usually a semiconductive material, such as Si. Optionally, the substrate 119 usually has suitable dopant of a first conductivity, such as P type or N type dopant, preferably P or P− type. The segregating pillar 123 is disposed inside the core of the protuberant structure 120 which extends from the substrate 119 and has the first conductivity, preferably P+type. The pair 140/141 which is segregated by the segregating pillar 123 occupies part of the substrate 119 and the protuberant structure 120 at the same time, and is adjacent to the bottom of the segregating pillar 123. The pair 140/141 also has the opposite conductivity, such as N type, to the substrate 119 to serve as a pair of bottom source/drain.

The diffused doped layer 122 is disposed inside of the protuberant structure 120, adjacent to the top of the segregating pillar 123 and has the same conductivity type as the substrate 119. The doped deposition layer 112 which serves as a top source/drain covers and directly contacts the top surface of the protuberant structure 120 as well as the diffused doped layer 122 to serve as a channel region. The top layer 111 is disposed on the top of the protuberant structure 120 and covers the doped deposition layer 112. The gate oxide layer 150 is disposed in the parallel trenches 152/153/154 and attached to the sidewall 121 of the protuberant structure 120. The gate oxide layer 150 directly contacts the doped deposition layer 112, the out-diffused layer 114 and the horizontal implanting regions 142/144 and the vertical implanting regions 143/145 of the segregated bit-lines 140/141. The word-line 161 includes a conductive material, preferably tungsten or doped polysilicon. The word-line 161 fills the parallel trenches 152/153/154, covers and directly contacts the gate oxide layer 150 so that the gate oxide layer 150 is sandwiched between the word-lines 161, the doped deposition layer 112, the out-diffused layer 114, the horizontal implanting regions 142/144 and the vertical implanting regions 143/145 of the segregated bit-lines 140/141.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A non-floating vertical transistor, comprising:
a substrate of a first dopant type;
a protuberant structure extending from said substrate and comprising:
    a segregating pillar disposed inside said protuberant structure and having said first dopant type;
    a pair of segregated bit-lines adjacent to the bottom of said segregating pillar, segregated by said segregating pillar and having a second dopant type; and
    a diffused doped layer adjacent to the top of said segregating pillar and having one of said first dopant type and said second dopant type;
a doped deposition layer covering a top surface of said protuberant structure and having said second dopant type;

a top layer disposed on said top surface of said protuberant structure and covering said doped deposition layer;

a gate oxide layer attached to the sidewall of said protuberant structure, and directly contacting said diffused doped layer, said substrate and part of said segregated bit-lines; and a word-line directly contacting said gate oxide layer so that said gate oxide layer is sandwiched between said word-line and said doped deposition layer.

2. The non-floating vertical transistor of claim 1, wherein said protuberant structure is an island-like pillar.

3. The non-floating vertical transistor of claim 1, further comprising:

a plurality of said protuberant structures.

4. The non-floating vertical transistor of claim 1, wherein each segregated bit-line in said pair of segregated bit-lines has a cross-section of an L shape.

5. The non-floating vertical transistor of claim 1, wherein said second dopant type is N type and said first dopant type is P type.

6. The non-floating vertical transistor of claim 3, wherein said word-line is disposed between two adjacent said protuberant structures.

7. The non-floating vertical transistor of claim 3, wherein said gate oxide layer segregates said protuberant structures which are adjacent and extends between said protuberant structures which are adjacent in a wave-like pattern.

8. The non-floating vertical transistor of claim 3, wherein said protuberant structures which are adjacent and have said word-line in between have a space s and the thickness of said word-line is d so that $s<2d$.

9. The non-floating vertical transistor of claim 6, wherein said protuberant structures which are adjacent and have said word-line in between have a distance t and the thickness of said word-line is d so that $2d<t$.

10. The non-floating vertical transistor of claim 5, further comprising:

an out-diffused layer sandwiched between said doped deposition layer and said diffused doped layer to serve as a channel region.

11. A method to form a non-floating vertical transistor, comprising:

providing a stack material layer comprising a top layer, a doped deposition layer, a buffer layer and a substrate, wherein said substrate has a first dopant type and said buffer layer has said first dopant type;

patterning said stack material layer to form a plurality of protuberant structures in communicating spaces;

performing a vertical implanting procedure to form a segregating pillar disposed inside said protuberant structure and having said first dopant type;

performing a tilt-angle implanting procedure to form a pair of segregated bit-lines in said protuberant structures and in said substrate, wherein said segregated bit-lines is adjacent to the bottom of said segregating pillar, segregated by said segregating pillar and having said second dopant type;

forming a gate oxide layer attached to the sidewall of said protuberant structures, covering the bottom of said communicating space and segregating said protuberant structures which are adjacent to each other; and filling said communicating space which has said gate oxide layer on the bottom with a metal to form a word line to obtain said non-floating vertical transistor.

12. The method to form a non-floating vertical transistor of claim 11, wherein before patterning said stack material layer further comprising:

performing an annealing procedure to form an out-diffused layer disposed between said doped deposition layer and said buffer layer.

13. The method to form a non-floating vertical transistor of claim 11, wherein said stack material layer is patterned so that said stack material layer becomes a plurality of island-like pillars in said communicating space.

14. The method to form a non-floating vertical transistor of claim 11, wherein before performing said vertical implanting procedure and performing said tilt-angle implanting procedure further comprising:

filling said communicating space with a substitute silicon material which has diffusing dopant; and performing a diffusing procedure so that said diffusing dopant diffuses outwards to the sidewall of said protuberant structures so that the sidewall of said protuberant structures forms a diffused doped layer and said buffer layer vanishes; and removing said substitute silicon material after said diffusing procedure.

15. The method to form a non-floating vertical transistor of claim 11, wherein said vertical implanting procedure further comprising:

forming a patterned photoresist to partially expose said top layer on the top of said protuberant structures; and performing said vertical implanting procedure in the presence of said patterned photoresist so that said vertical implanting procedure goes into said diffused doped layer of said protuberant structures and into said substrate of said protuberant structures to form said segregating pillar.

16. The method to form a non-floating vertical transistor of claim 11, wherein said tilt-angle implanting procedure comprises at least one tilt-angle ion implanting step.

17. The method to form a non-floating vertical transistor of claim 11, wherein said gate oxide layer is conformally attached to the sidewall of said protuberant structures, disposed between said protuberant structures which are adjacent to one another to electrically segregate said protuberant structures which are adjacent to one another, and extending between said protuberant structures which are adjacent to one another in a wave-like shape to divide said communicating space into trenches which are adjacent to one another.

18. The method to form a non-floating vertical transistor of claim 11, wherein said protuberant structures which are adjacent to one another and have said word-line in between have a distance t and the thickness of said word-line is d so that $2d<t$.

19. The method to form a non-floating vertical transistor of claim 11, wherein each segregated bit-line in said pair of segregated bit-lines has a cross-section of an L shape.

20. The method to form a non-floating vertical transistor of claim 16, wherein said vertical implanting procedure further comprising:

separately performing a first tilt-angle implanting procedure and a second tilt-angle implanting procedure to form said segregated bit-lines on the vertical sidewall of said communicating space and on the bottom of said communicating space for use in said protuberant structures.

21. The method to form a non-floating vertical transistor of claim 18, wherein said protuberant structures which are adjacent to one another and have said gate oxide layer in between have a space s and the thickness of said word-line is d so that $s<2d$.

* * * * *